(12) United States Patent
Magoshi

(10) Patent No.: US 6,661,736 B2
(45) Date of Patent: *Dec. 9, 2003

(54) APPARATUS AND METHOD FOR DISTRIBUTING A CLOCK SIGNAL ON A LARGE SCALE INTEGRATED CIRCUIT

(75) Inventor: Hidetaka Magoshi, Palo Alto, CA (US)

(73) Assignee: Sony Computer Entertainment Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/278,197

(22) Filed: Oct. 22, 2002

(65) Prior Publication Data

US 2003/0052343 A1 Mar. 20, 2003

Related U.S. Application Data

(63) Continuation of application No. 09/929,633, filed on Aug. 14, 2001, now Pat. No. 6,538,957.
(60) Provisional application No. 60/290,762, filed on May 14, 2001, and provisional application No. 60/290,761, filed on May 14, 2001.

(51) Int. Cl.[7] .................................................. G11C 7/00
(52) U.S. Cl. ....................................... 365/233; 365/194
(58) Field of Search ................................. 365/233, 194, 365/191; 327/175

(56) References Cited

U.S. PATENT DOCUMENTS 5,815,427 A     9/1998   Cloud et al.
6,292,016 B1    9/2001   Jefferson et al.

OTHER PUBLICATIONS

"Digital VLSI Systems Operating at Microwave Frequencies," Spaceborne Inc., Feb. 1998.
"Highly Pipelined VLSI Systems for Signal Processing," B. Nelson, 1999.

Primary Examiner—Vu A. Le
(74) Attorney, Agent, or Firm—Lerner, David, Littenberg, Krumholz & Mentlik, LLP

(57) ABSTRACT

A semiconductor chip includes a plurality of regional clock distribution nodes located on the semiconductor chip; a plurality of clock buffers, each being operable to produce a respective output clock signal from an associated input clock signal in accordance with an error signal, the outputs of a subset of the plurality of clock buffers being coupled to respective ones of the plurality of regional clock distribution nodes; and a plurality of phase detectors, each being operable to produce a respective error signal indicative of phase differences between the output clock signals of at least two of the regional clock distribution nodes, wherein the clock buffers adjust the respective output clock signals in accordance with the respective error signals.

23 Claims, 3 Drawing Sheets

APPARATUS AND METHOD FOR DISTRIBUTING A CLOCK SIGNAL ON A LARGE SCALE INTEGRATED CIRCUIT

CROSS REFERENCE TO RELATED APPLICATIONS

This application is a continuation of U.S. patent application Ser. No. 09/929,633, filed Aug. 14, 2001, entitled APPARATUS AND METHOD FOR DISTRIBUTING A CLOCK SIGNAL ON A LARGE SCALE INTEGRATED CIRCUIT, which has been allowed U.S. Pat. No. 6,538,957, and which claims the benefits of U.S. Provisional Patent Application No. 60/290,762, filed May 14, 2001, entitled APPARATUS AND METHOD FOR DISTRIBUTING A CLOCK SIGNAL ON A LARGE SCALE INTEGRATED CIRCUIT; and U.S. Provisional Patent Application No. 60/290,761, filed May 14, 2001, entitled APPARATUS AND METHOD FOR DISTRIBUTING A CLOCK SIGNAL ON A LARGE SCALE INTEGRATED CIRCUIT, the entire disclosures of all of the above being hereby incorporated by reference.

BACKGROUND OF THE INVENTION

The present invention relates to the distribution of clock signals to various points on a semiconductor device, such as a large scale integrated (LSI) circuit, and, more particularly, the present invention relates to the use of active feedback and correction of clock skew on a global level.

A system clock signal is often used by digital circuitry, such as digital circuitry implemented using a LSI circuit, to synchronously execute certain logic functions. For example, ultra-deep sub-micron (UDSM) microprocessors employ digital circuitry that use system clock signals to synchronously execute logic functions. These microprocessors operate at system clock frequencies of 1 GHz and higher. The system clock signal of a given LSI circuit is often split into many paths to service many different portions of the digital circuitry. Ideally, the system clock signals at different portions of the digital circuitry exhibit exactly the same timing characteristics so that the different portions of the digital circuitry operate in exact synchronization. In practice, however, the system clock signals at various points throughout the digital circuitry exhibit differing timing characteristics, such as differing rising and/or falling edges (i.e., transitions), differing duty cycles, and/or differing frequencies. These non-ideal characteristics are often referred to as clock jitter and clock skew.

Clock jitter relates to the inaccuracies inherent in generating the system clock signal. The non-ideal characteristics of the system clock signals due to clock jitter effect all portions of the LSI circuit in the same way, irrespective of how the system clock signals are distributed to those portions of the circuit. Clock skew relates to the inaccuracies introduced into the system clock signals by the distribution technique employed to split the system clock into many paths and deliver the clock signals to different portions of the digital circuit.

Sources of clock skew may be classified as being statically occurring or dynamically occurring. Statically occurring sources of clock skew are caused by the LSI design or manufacturing process irrespective of the operating conditions of the LSI circuit. Dynamically occurring sources of clock skew are caused by the operating conditions of the LSI circuit, which may also be functions of the LSI circuit design or manufacturing process.

Statically occurring sources of clock skew include (i) variations in transistor load capacitance (e.g., gate load capacitance); (ii) RC delay of circuit interconnections (e.g., the asymmetry of wire lengths and widths); (iii) variations and/or asymmetries in cross-coupling capacitance between wires (e.g., inter-wiring capacitance); and (iv) semiconductor process variations (e.g., transistor threshold voltage variations, transistor ON resistance variations, wiring variations, veer, and contact RC variations).

Dynamically occurring sources of clock skew include (i) cross-coupling between wire lengths due to inter-wiring capacitance; (ii) cross-coupling between wire lengths due to inductive coupling; (iii) cross-coupling due to return path current; (iv) temperature variations; and (v) variations in VDD and VSS (e.g., DC operating voltage variations).

Unfortunately, the variations in the timing characteristics of the system clock signals due to clock skew result in undesirable errors in the operation of the digital circuitry of the LSI circuit. The problem is exacerbated as the size (i.e., number of logic gates and corresponding circuit area) increase and/or as the clock signal frequency increases.

Various techniques have been developed and employed to ameliorate the undesirable affects of clock skew. These techniques include (i) utilizing clock bars (i.e., relatively wide bars to carry the system clock to various portions of the LSI circuit); (ii) RC delay balancing (i.e., wiring techniques that focus on wiring geometry to match RC delay characteristics); (iii) utilizing a grid structure in distributing the system clock signal; (iv) utilizing a hierarchical structure in partitioning the LSI circuit into regions; (v) utilizing active feedback in compensating the system clock signal; (vi) utilizing local oscillators in various regions of the LSI circuit and an overall resonance for the LSI circuit; and (vii) utilizing the resonances of wiring loops. For various reasons, these techniques have not been adequately successful in addressing the undesirable problems caused by clock skew.

SUMMARY OF THE INVENTION

In accordance with one or more aspects of the present invention, a semiconductor chip includes a plurality of regional clock distribution nodes located on the semiconductor chip; a plurality of clock buffers, each being operable to produce a respective output clock signal from an associated input clock signal in accordance with an error signal, the outputs of a subset of the plurality of clock buffers being coupled to respective ones of the plurality of regional clock distribution nodes; and a plurality of phase detectors, each being operable to produce a respective error signal indicative of phase differences between the output clock signals of at least two of the regional clock distribution nodes, wherein the clock buffers adjust the respective output clock signals in accordance with the respective error signals.

Preferably, each clock buffer includes a delay lock loop (DLL) circuit providing a DLL function and each clock buffer produces the respective output clock signal from the associated input clock signal in accordance with the DLL function. The DLL circuits of an Nth subset of clock buffers preferably adjust the respective output clock signals such that the output clock signals of the regional clock distribution nodes are substantially coincident.

Preferably, the clock buffers are coupled to one another to form a clock distribution tree from a clock source to the clock distribution nodes. The clock distribution tree may be an H-tree.

Preferably, first through Nth level subsets of the plurality of clock buffers define distribution levels of the distribution tree. The respective clock buffers of the first level subset are operable to produce respective first level output clock signals from a source clock signal in accordance with their DLL functions and one of the error signals. Respective groups of clock buffers of the second level subset are operable to produce respective second level output clock signals from the respective first level clock signals in accordance with their DLL functions and respective error signals. Respective groups of clock buffers of the third level subset are operable to produce respective third level output clock signals from the respective second level clock signals in accordance with their DLL functions and respective error signals. Respective groups of clock buffers of the Nth level subset are operable to produce the output clock signals of the respective clock distribution nodes from the respective third level clock signals in accordance with their DLL functions and respective error signals.

In accordance with one or more further aspects of the present invention, the semiconductor chip includes a global operative area defined by a plurality of regional areas, at least one sub-regional area within each regional area, and at least one local area within each sub-regional area; and at least one of the regional clock distribution nodes is disposed in each of the regional areas such that the respective outputs of an Nth level subset of clock buffers provides a regional clock signal to each of the regional areas.

The semiconductor chip preferably further includes a plurality of sub-regional clock distribution nodes disposed in each sub-regional area; and a plurality of RC-balanced clock signal paths coupled from each regional clock distribution node to the respective sub-regional clock distribution nodes of each sub-regional area such that respective sub-regional clock signals are provided at each regional clock distribution node.

In accordance with one or more further aspects of the invention, the semiconductor chip may further include a plurality of local clock distribution nodes arranged in respective distribution grids, at least one of the distribution grids being disposed in each local area; and a plurality of local clock buffers, respective ones of the local clock buffers receiving an associated one of the sub-regional clock signals from one of the sub-regional clock distribution nodes and producing a local clock signal on a respective one of the distribution grids, each local clock buffer including at least part of an active feedback function operable to cause the local clock signal at one of the local clock distribution nodes of the respective distribution grid to be substantially coincident with the associated sub-regional clock signal.

The semiconductor chip preferably further includes a phase lock loop operable to adjust a phase of the global source clock signal such that a phase difference between a system clock signal and one of the local clock signals is minimized.

In accordance with one or more further aspects of the present invention, a method includes: producing respective output clock signals from respective associated input clock signals in accordance with respective error signals; coupling a subset of the output clock signals to respective ones of a plurality of regional clock distribution nodes; producing the respective error signals as a function of phase differences between the output clock signals of at least two of the regional clock distribution nodes; and adjusting the respective output clock signals in accordance with the respective error signals.

Other features and advantages of the present invention will become apparent in light of the description herein taken in combination with the accompanying drawings.

BRIEF DESCRIPTION OF THE DRAWINGS

For the purposes of illustrating the invention, there are shown in the drawings forms which are presently preferred, it being understood, however, that the invention is not limited by the precise arrangements and instrumentalities shown.

DETAILED DESCRIPTION

Figure 1:
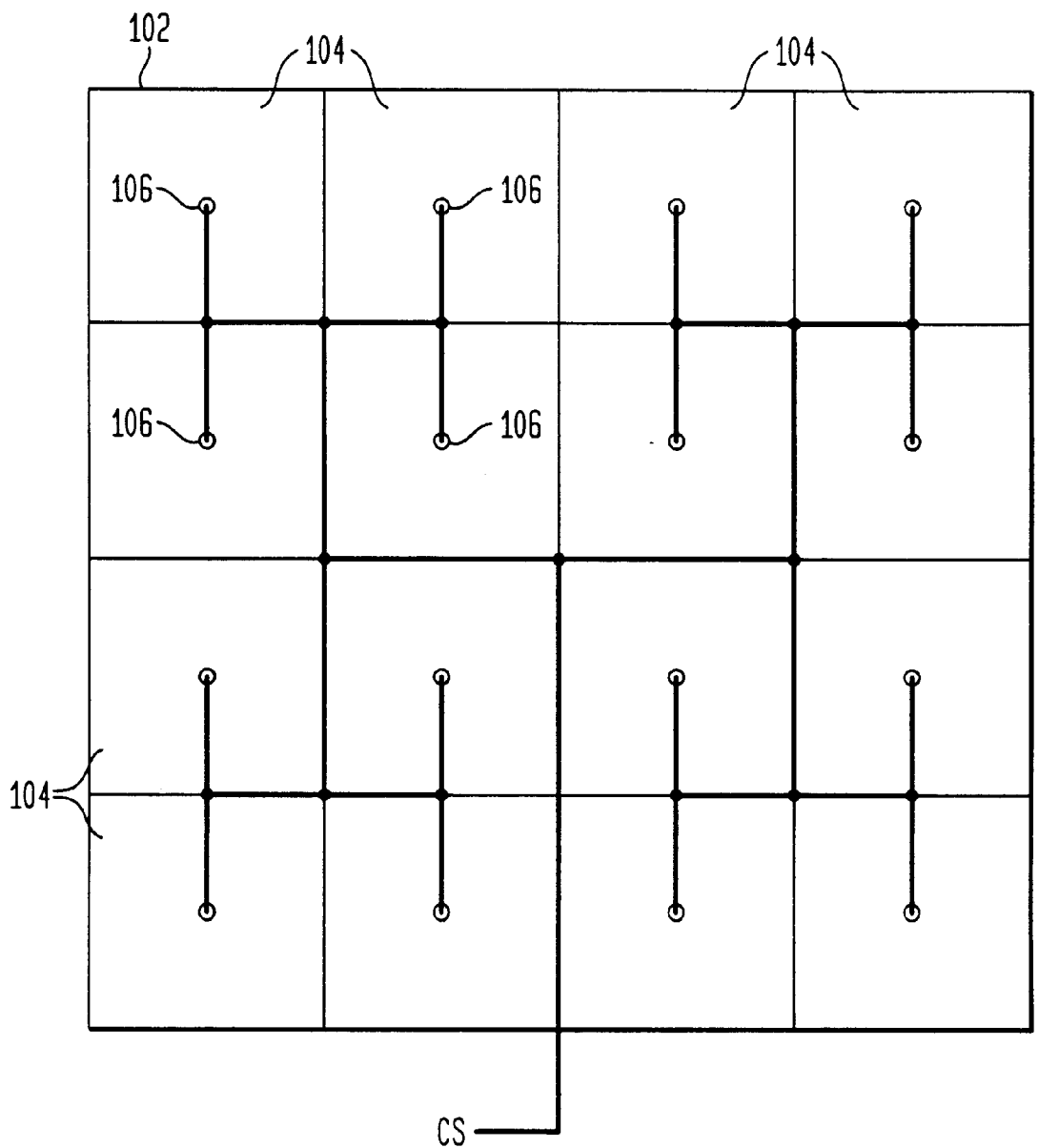
FIG. 1 is a high level schematic diagram of a semiconductor device employing one or more aspects of the present invention.

Referring now to the drawings, wherein like numerals indicate like elements, there is shown in FIG. 1 a semiconductor device 100, such as an LSI circuit, employing one or more aspects of the present invention.

The semiconductor device 100 preferably includes a semiconductor chip 102 that includes a global operative area defined by a plurality of regional areas 104, sixteen such regional areas 104 being shown. The semiconductor chip 102 preferably includes a plurality of clock distribution nodes 106, where one or more of the clock distribution nodes 106 are disposed in each of the regional areas 104. It is preferred that one clock distribution node 106 is disposed in each regional area 104. It is preferred that the clock distribution nodes 106 are coupled to one another to form a clock distribution tree from a clock source CS to the clock distribution nodes 106, it being preferred that the clock distribution tree is an H-tree.

Figure 2:
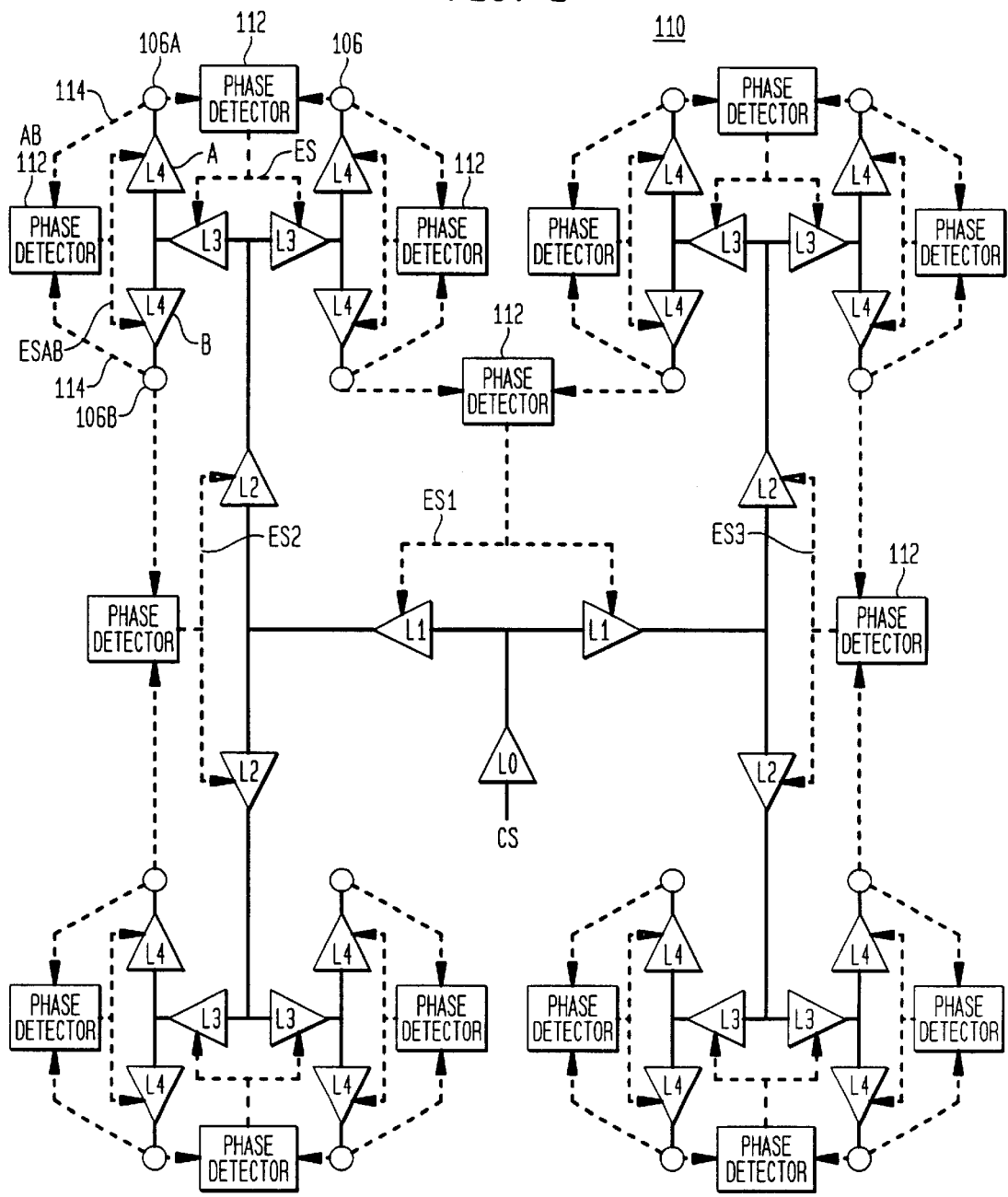
FIG. 2 is a more detailed block diagram of a clock signal distribution system in accordance with one or more aspects of the present invention.

Reference is now made to FIG. 2, which is a block diagram of a clock distribution circuit 110 that may be employed to achieve the distribution tree shown in FIG. 1. The clock distribution circuit 110 preferably includes a plurality of clock buffers, labeled L1–L4, and a plurality of phase detectors 112. The plurality of clock buffers L1–L4 each preferably include a delay lock loop (DLL) circuit, where the DLL circuit provides the well-known DLL function. Each clock buffer L1–L4 is preferably operable to produce a respective output clock signal from an associated input clock signal in accordance with its DLL function. The outputs of the L4 buffers are coupled to respective ones of the plurality of clock distribution nodes 106.

The phase detectors 112 are each preferably operable to produce a respective error signal ES indicative of phase differences between the output clock signals of at least two of the clock distribution nodes 106. For example, clock buffer L4A may provide an output clock signal to clock distribution node 106A and clock buffer L4B may provide an output clock signal to clock distribution node 106B. Phase detector 112AB preferably monitors the output clock signals on clock distribution nodes 106A and 106B by way of sense lines 114 and produces an error signal ESAB indicative of the phase difference between the output clock signals on clock distribution nodes 106A and 106B. Any of the known phase detector techniques may be employed to implement the phase detectors 112 of the invention.

Continuing with the above example, the respective DLL circuits of clock buffers L4A and L4B preferably adjust the respective output clock signals thereof in accordance with the error signal ESAB such that the output clock signals of the clock distribution nodes 106A and 106B are substantially coincident. Any of the known DLL circuit techniques made be employed to implement the DLL circuit in accordance with the present invention. For example, the DLL circuit may include a programmable delay line capable of delaying transitions in the output signal (as compared to the input signal) as a function of the error signal ES (such as ESAB).

Preferably, the plurality of clock buffers are grouped into first through Nth level subsets to define distribution levels within the clock distribution tree. For example, clock buffers L1 preferably form a first level subset, clock buffers L2 preferably form a second level subset, clock buffers L3 preferably form a third level subset, and clock buffers L4 preferably form a forth (or Nth) level subset. Although this implies that there are four levels of clock buffers, and it is preferred that there are, the clock distribution circuit 110 may employ any number of levels of clock buffers without departing from the scope of the invention. It is noted that the four levels of clock buffers L1–L4 may advantageously service sixteen clock distribution nodes 106.

The respective clock buffers L1 of the first level subset are preferably operable to produce respective first level output clock signals from the clock source CS in accordance with their DLL functions and a first one of the error signals ES1. The clock buffers L2 of the second level subset are preferably divided into two respective groups. One of the groups of clock buffers L2 of the second level subset is preferably operable to produce respective second level output clock signals from a respective one of the first level clock signals in accordance with their DLL functions and a second error signal ES2. The other group of clock buffers L2 of the second level subset is preferably operable to produce respective second level output clock signals from the other of the first level clock signals in accordance with their DLL functions and a third error signal ES3. Respective groups of clock buffers L3 of the third level subset are preferably operable to produce respective third level output clock signals from the respective second level clock signals in accordance with their DLL functions and associated error signals ES. This implementation/process is preferably repeated at each level until the desired number of levels is obtained to service the clock distribution nodes 106. In the example shown in FIG.2, the fourth level subset of clock buffers L4 produce output clock signals at the clock distribution nodes 106 from the respective third level clock signals in accordance with their DLL functions and associated error signals ES.

The block diagram of the clock distribution circuit 110 of FIG. 2 may be described in general terms to include: a plurality of regional clock distribution nodes 106 located on the semiconductor chip 102; and a plurality of clock buffers L grouped into i-th levels, where i=1, 2 . . . N. Each clock buffer L is preferably operable to output a respective i-th level clock signal from an associated (i–1)th level clock signal in accordance with a delay lock loop (DLL) function. The respective Nth level clock signals are preferably coupled to the regional clock distribution nodes 106. The clock distribution circuit 110 preferably further includes a plurality of phase detectors, each being operable to produce a respective error signal indicative of phase differences between the i-th level clock signals of respective pairs of the regional clock distribution nodes 106. The i-th level clock buffers L preferably adjust transitions of the respective i-th level clock signals in accordance with the DLL functions and the respective error signals.

Substantial coincidence of the output clock signals of the clock distribution nodes 106 may be obtained by properly initializing the clock buffers L1–L4 at each level to achieve desirable DLL functionality (e.g., proper lock). For example, at an initialization phase (or reset phase) the DLL circuits of the clock buffers L1–L4 are preferably initialized to a null or centered mode (i.e., they neither advance nor delay the transitions of the output clock signals with respect to the associated input clock signals). Next, the DLL circuits of the Nth level subset (e.g., the DLL circuits of clock buffers L4) are permitted to respond to the respective error signals ES such that substantial coincidence between the output clock signals of the clock distribution nodes 106 are obtained. Next, the DLL circuits of the next lower level (e.g., the DLL circuits of clock buffers L3) are permitted to respond to the error signals of the associated phase detectors 112 for that level. This process is repeated until a phase lock is obtained at each level.

Figure 3:
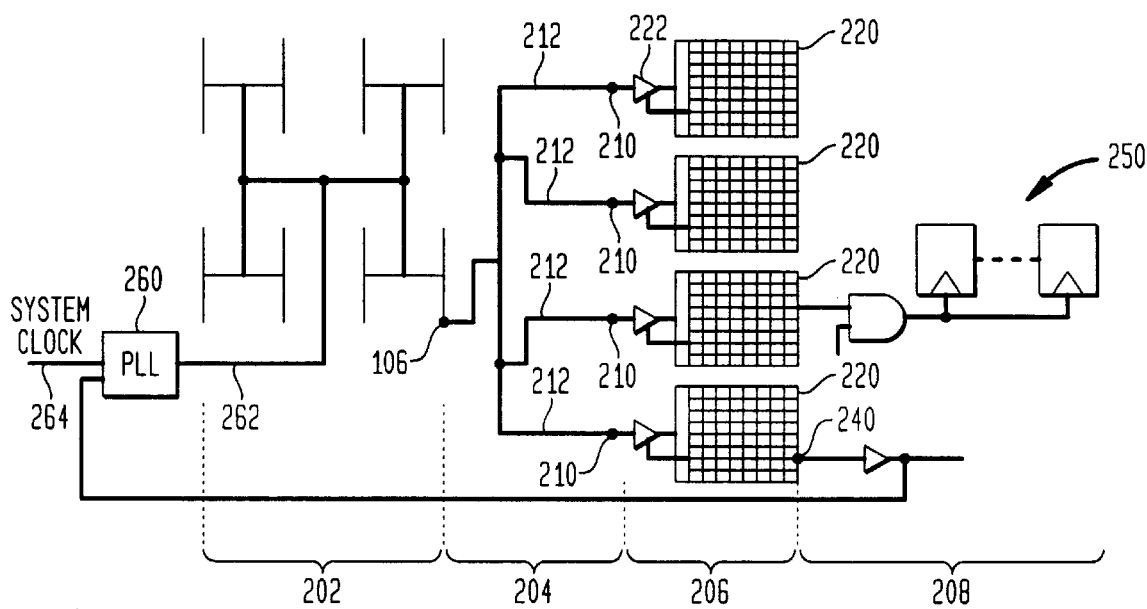
FIG. 3 is a high level diagram illustrating a clock distribution system in accordance with one or more further aspects of the present invention.

Reference is now made to FIG. 3, which is a high level diagram illustrating a clock distribution system 200 in accordance with one or more further aspects of the present invention. The clock distribution system 200 includes a number of stages (or levels) associated with certain areas of the semiconductor device 100 (FIG. 1). In particular, the semiconductor chip 102 preferably includes a global operative area 202 defined by a plurality of regional areas 204 (also shown in FIG. 1 at 104), at least one sub-regional area 206 within each regional area 204, and at least one local area 208 within each sub-regional area 206. The distribution tree, such as the H-tree, discussed hereinabove with respect to FIGS. 1 and 2 is preferably disposed on the semiconductor chip 102 such that at least one of the clock distribution nodes 106 (referred to hereinafter as regional clock distribution nodes) is disposed in each of the regional areas 204 and the respective outputs of the Nth level subset of clock buffers L4 provide a regional clock signal to each of the regional areas 204.

The system 200 also preferably includes a plurality of sub-regional clock distribution nodes 210, where at least one sub-regional clock distribution node 210 is disposed in each sub-regional area 206. Further, the system 200 preferably includes a plurality of RC-balanced clock signal paths 212 coupled from each regional clock distribution node 106 to the respective sub-regional clock distribution nodes 210 of the respective sub-regional areas. In this way, respective sub-regional clock signals are provided at each sub-regional clock distribution node 210. Any of the known RC-balanced techniques may be employed, such as utilizing signal paths of substantially equal lengths, substantially equal impedances (e.g., substantially equal capacitance per unit length, substantially equal inductance per unit length, and/or substantially equal resistance per unit length), etc. In any case, it is desirable that the RC-balanced clock signal paths 212 ensure some range of signal coincidence between the respective regional clock distribution node 106 and associated sub-regional clock distribution nodes 210.

The system 200 also preferably includes a plurality of local clock distribution nodes arranged in respective distribution grids 220, where at least one of the distribution grids 220 is disposed in each local area 208. A plurality of local clock buffers 222 are preferably employed to receive an associated one of the sub-regional clock signals from one of the sub-regional clock distribution nodes 210 to produce a local clock signal on a respective one of the distribution grids 220.

Figure 4:
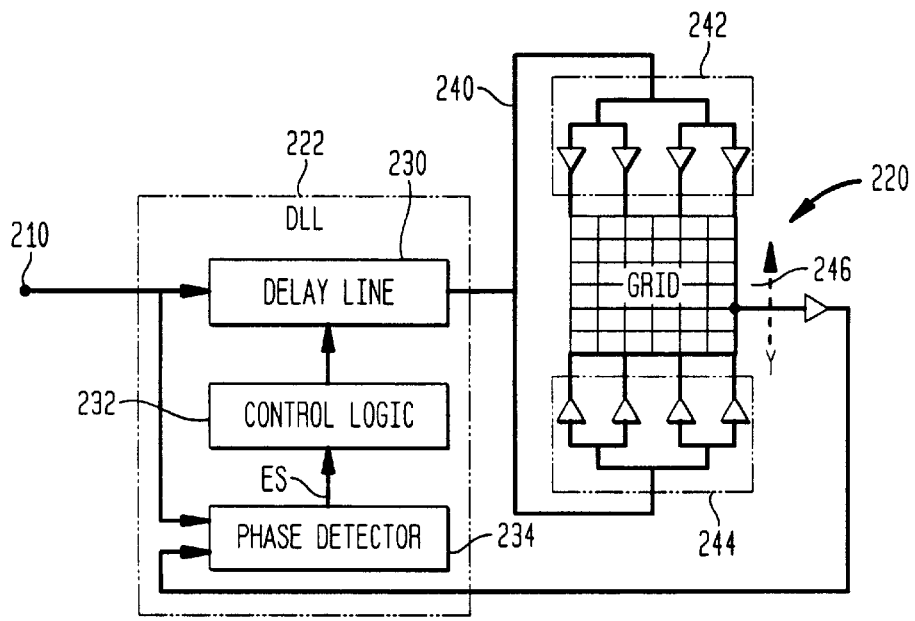
FIG. 4 is a block diagram of a clock distribution system that may be employed in the system of FIG. 3.

Each local clock buffer 222 preferably includes at least part of an active feedback function operable to cause the local clock signal at one of the local clock distribution nodes of the respective distribution grid 220 to be substantially coincident with the associated sub-regional clock signal of the associated sub-regional clock node 210. Any of the known active feedback techniques may be employed to achieve this function, such as the DLL technique. For example, as shown in FIG. 4, each local clock buffer 222 may include a DLL circuit including a delay line 230, control logic 232, and a phase detector 234. A given local clock buffer 222 receives a sub-regional clock signal from a sub-regional clock distribution node 210 and produces a clock signal on line 240 that is distributed over the grid 220 by way of respective sets of buffers 242, 244. Preferably, a local clock signal may be obtained from any point on the grid, for example, at 246 for use in the digital circuitry 250 (FIG. 3). The phase detector 234 is preferably operable to produce an error signal ES based on a phase difference between the local clock signal, for example at 246, at one of the local clock distribution nodes and the associated sub-regional clock signal from the sub-regional clock distribution node 210. The error signal ES is utilized by the delay line 230 (via the control logic 232) to adjust the time of the transitions of the clock signal on line 240 and, by extension, the transitions of the local clock signals of the grid 220.

Turning again to FIG. 3, the system 200 preferably further includes a phase lock loop (PLL) 260 operable to adjust a phase of the global source clock signal on line 262 such that a phase difference between a system clock signal on line 264 and one of the local clock signals, such as at 246 (FIG. 4), is minimized. It is most preferred that the local clock signal is taken from one of the local clock distribution nodes that is substantially distant from the associated local clock buffer 222.

In accordance with at least one further aspect of the present invention, a method of distributing clock signals to areas of a semiconductor chip, for example the semiconductor chip 102 of FIG. 1, is contemplated. The method may be achieved utilizing suitable hardware, such as that illustrated above in FIGS. 1–4 and/or utilizing any of the known processors now available or hereinafter developed. The method preferably includes: (i) receiving a clock source signal (e.g., a 0-th level clock signal); (ii) producing respective i-th level clock signals from associated (i−1)th level clock signals, where i=1, 2, . . . N; (iii) distributing the Nth level clock signals to respective regional clock distribution nodes located in regional areas of the semiconductor chip; (iv) producing respective error signals indicative of phase differences between respective pairs of the Nth level clock signals of the regional clock distribution nodes; and (v) adjusting instances at which the i-th level clock signals transition in accordance with the respective error signals such that the Nth level clock signals of the regional clock distribution nodes are substantially coincident.

The method preferably further includes dividing the semiconductor chip into a global operative area defined by a plurality of regional areas, at least one sub-regional area within each regional area, and at least one local area within each sub-regional area, wherein at least one of the regional clock distribution nodes is disposed in each of the regional areas such that a regional clock signal is provided to each of the regional areas. The method may also include distributing the regional clock signals over a plurality of RC-balanced clock signal paths coupled from each regional clock distribution node to respective sub-regional clock distribution nodes, at least one sub-regional clock distribution node being disposed in each sub-regional area, such that respective sub-regional clock signals are provided at each sub-regional clock distribution node.

The method preferably further includes distributing the respective sub-regional clock signals over respective distribution grids, each coupled to a respective plurality of local clock distribution nodes, at least one of the distribution grids being disposed in each local area, such that respective local clock signals are provided at the respective pluralities of local clock distribution nodes; and adjusting instances at which the respective sub-regional clock signals transition in accordance with respective local DLL functions prior to distribution over the respective distribution grids such that the local clock signal at one of the local clock distribution nodes of the respective distribution grids is substantially coincident with the respective sub-regional clock signals.

The method may also include adjusting a phase of the global source clock signal such that a phase difference between a system clock signal and one of the local clock signals is minimized.

In accordance with one or more further aspects of the present invention, a method is contemplated of distributing clock signals to a plurality of regional clock distribution nodes located on a semiconductor chip using a plurality of clock buffers grouped into i-th levels, each clock buffer being operable to output a respective i-th level clock signal from an associated (i−1)th level clock signal in accordance with a delay lock loop (DLL) function, where i=1, 2 . . . N and the respective Nth level clock signals are coupled to the regional clock distribution nodes. The method involves using a plurality of phase detectors, each being operable to produce a respective error signal indicative of phase differences between the clock signals of respective pairs of the regional clock distribution nodes, where the i-th level clock buffers adjust transitions of the respective i-th level clock signals in accordance with the DLL functions and the respective error signals.

The method includes causing the respective i-th level clock buffers to neither substantially delay nor substantially advance the transitions of the respective i-th level clock signals; permitting the (N−j)th level clock buffers to adjust the transitions of the respective (N−i)th level clock signals, where j=0, 1, 2, . . . N−1; and repeating the previous step for each level such that the Nth level clock signals of the regional clock distribution nodes are substantially coincident with one another and a 0th level clock signal.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A semiconductor chip, comprising:

a plurality of regional clock distribution nodes located on the semiconductor chip;

a plurality of clock buffers, and each being operable to produce a respective output clock signal from an associated input clock signal in accordance with an error signal, the outputs of a subset of the plurality of clock buffers being coupled to respective ones of the plurality of regional clock distribution nodes; and a plurality of phase detectors, each being operable to produce a respective error signal indicative of phase differences between the output clock signals of at least two of the regional clock distribution nodes, wherein the clock buffers adjust the respective output clock signals in accordance with the respective error signals.

2. The semiconductor chip of claim 1, wherein each clock buffer includes a delay lock loop (DLL) circuit providing a DLL function and receiving the error signal.

3. The semiconductor chip of claim 2, wherein the DLL circuits of an Nth subset of clock buffers adjust the respective output clock signals in accordance with the respective error signals such that the output clock signals of the regional clock distribution nodes are substantially coincident.

4. The semiconductor chip of claim 1, wherein the clock buffers are coupled to one another to form a clock distribution tree from a global clock source to the regional clock distribution nodes.

5. The semiconductor chip of claim 4, wherein the clock distribution tree is an H-tree.

6. The semiconductor chip of claim 4, wherein first through Nth level subsets of the plurality of clock buffers define distribution levels of the distribution tree.

7. The semiconductor chip of claim 6, wherein the respective clock buffers of the first level subset are operable to produce respective first level output clock signals from a global source clock signal of the global clock source in accordance with one of the error signals.

8. The semiconductor chip of claim 7, wherein the one error signal is provided by one of the plurality of phase detectors that monitors a phase difference between the output clock signals of two of the regional clock distribution nodes.

9. The semiconductor chip of claim 7, wherein respective groups of clock buffers of a second level subset are operable to produce respective second level output clock signals from the respective first level clock signals in accordance with respective error signals.

10. The semiconductor chip of claim 9, wherein the respective error signals are provided by respective phase detectors that monitor respective phase differences between the output clock signals of respective pairs of the regional clock distribution nodes.

11. The semiconductor chip of claim 9, wherein respective groups of clock buffers of a third level subset are operable to produce respective third level output clock signals from the respective second level clock signals in accordance with respective error signals.

12. The semiconductor chip of claim 11, wherein the respective error signals are provided by respective phase detectors that monitor respective phase differences between the output clock signals of respective pairs of the regional clock distribution nodes.

13. The semiconductor chip of claim 11, wherein respective groups of clock buffers of a fourth level subset are operable to produce the output clock signals of the respective regional clock distribution nodes from the respective third level clock signals in accordance with respective error signals.

14. The semiconductor chip of claim 13, wherein the respective error signals are provided by respective phase detectors that monitor respective phase differences between the output clock signals of respective pairs of the regional clock distribution nodes.

15. The semiconductor chip of claim 1, wherein:
the semiconductor chip includes a global operative area defined by a plurality of regional areas, at least one sub-regional area within each regional area, and at least one local area within each sub-regional area; and
at least one of the regional clock distribution nodes is disposed in each of the regional areas such that the respective outputs of the subset of clock buffers provides a regional clock signal to each of the regional areas.

16. The semiconductor chip of claim 15, further comprising:
a plurality of sub-regional clock distribution nodes, at least one sub-regional clock distribution node being disposed in each sub-regional area; and
a plurality of RC-balanced clock signal paths coupled from each regional clock distribution node to the respective sub-regional clock distribution nodes of the respective regional areas such that respective sub-regional clock signals are provided at each sub-regional clock distribution node.

17. The semiconductor chip of claim 16, further comprising:
a plurality of local clock distribution nodes arranged in respective distribution grids, at least one of the distribution grids being disposed in each local area; and
a plurality of local clock buffers, respective ones of the local clock buffers receiving an associated one of the sub-regional clock signals from one of the sub-regional clock distribution nodes and producing a local clock signal on a respective one of the distribution grids, each local clock buffer including at least part of an active feedback function operable to cause the local clock signal at one of the local clock distribution nodes of the respective distribution grid to be substantially coincident with the associated sub-regional clock signal.

18. The semiconductor chip of claim 17, wherein:
each local clock buffer includes a delay lock loop (DLL) circuit providing a DLL function and is operable to produce a respective one of the local clock signals from the associated sub-regional clock signal in accordance with the DLL function and an associated error signal; and
the semiconductor chip further comprises a plurality of local phase detectors, each being operable to produce a respective one of the error signals based on phase differences between the local clock signal at the one of the local clock distribution nodes and the associated sub-regional clock signal.

19. The semiconductor chip of claim 17, further comprising a phase lock loop operable to adjust a phase of the global source clock signal such that a phase difference between a system clock signal and one of the local clock signals is minimized.

20. The semiconductor chip of claim 19, wherein the one of the local clock signals is taken from one of the local clock distribution nodes that is substantially distant from the associated local clock buffer.

21. A method, comprising:
producing respective output clock signals from respective associated input clock signals in accordance with respective error signals;
coupling a subset of the output clock signals to respective ones of a plurality of regional clock distribution nodes;
producing the respective error signals as a function of phase differences between the output clock signals of at least two of the regional clock distribution nodes; and
adjusting the respective output clock signals in accordance with the respective error signals.

22. The method of claim 21, further comprising adjusting the output clock signals in accordance with respective delay lock loop (DLL) functions responding to the respective error signals.

23. The method of claim 22, further comprising adjusting the subset of respective output clock signals in accordance with the respective error signals such that the output clock signals of the regional clock distribution nodes are substantially coincident.

* * * * *